United States Patent
Küçükçakar

[19]

[11] Patent Number: 5,815,715
[45] Date of Patent: Sep. 29, 1998

[54] METHOD FOR DESIGNING A PRODUCT HAVING HARDWARE AND SOFTWARE COMPONENTS AND PRODUCT THEREFOR

[75] Inventor: Kayhan Küçükçakar, Scottsdale, Ariz.

[73] Assignee: Motorola, Inc., Schaumburg, Ill.

[21] Appl. No.: 463,228

[22] Filed: Jun. 5, 1995

[51] Int. Cl.⁶ .................................................. G06F 9/45
[52] U.S. Cl. .......................................................... 395/705
[58] Field of Search .................................. 395/700, 650, 395/701, 702, 705, 706; 364/488, 489, 490, 491

[56] References Cited

U.S. PATENT DOCUMENTS

| | | | |
|---|---|---|---|
| 5,005,136 | 4/1991 | Van Berkel et al. | |
| 5,197,016 | 3/1993 | Sugimoto et al. | 364/490 |
| 5,287,511 | 2/1994 | Robinson et al. | 395/700 |
| 5,301,318 | 4/1994 | Mittal | 395/701 |
| 5,377,122 | 12/1994 | Werner et al. | 395/488 |
| 5,416,719 | 5/1995 | Pribetich | 364/489 |
| 5,491,640 | 2/1996 | Sharma et al. | 395/488 |
| 5,524,244 | 6/1996 | Robinson et al. | 395/700 |
| 5,535,393 | 7/1996 | Reeve et al. | 395/706 |
| 5,551,013 | 8/1996 | Beausoleil et al. | 395/500 |

*Primary Examiner*—Emanuel Todd Voeltz
*Assistant Examiner*—Peter J. Corcoran, III
*Attorney, Agent, or Firm*—Rennie William Dover

[57] ABSTRACT

A computing system (10) and a method for designing the computing system (10) using hardware and software components. The computing system (10) includes programmable coprocessors (12, 13) having the same architectural style. Each coprocessor includes a sequencer (36) and a programmable interconnect network (34) and a varying number of functional units and storage elements. The computing system (10) is designed by using a compiler (71) to generate a host microprocessor code from a portion of an application software code and a coprocessor code from the portion of the application software code. The compiler (71) uses the host microprocessor code to determine the execution speed of the host microprocessor and the coprocessor code to determine the execution speed of the coprocessor and selects one of the host microprocessor or the coprocessor for execution of the portion of the application software code. Then the compiler (71) creates a code that serves as the software program.

21 Claims, 8 Drawing Sheets

```
/*"C" application ....                    103
 *Function declaration
 */ void foo ( a, start, end, constant1)

double a[][];
int start, end;
double constant1;

{
        int i;

for ( i=start; i<=end; i++ ) {
                a[i] = ( a[i] + a[i-1] ) / constant1;
        }
}

/*Run-time function call */ foo ( b, 1, 50, 2.0 );
```

```
CYCLES

1   Foo:    POP     Constant1       //pop argument from stack
1           POP     END             //pop argument from stack
1           POP     START           //pop argument from stack
1           POP     BASEA           //pop argument from stack 1           LD      i, START        //Load contents of START into i
1   LOOP:   CMP     i, END          //Compare i to END
1           JGT     Done            //Jump if i > END
1           LD      ADDR, BASEA
1           ADD     ADDR, i
1           LD      R1, (ADDR)      //Load R1 indirect from ADDR
1           DEC     ADDR            //Decrement ADDR1
1           LD      R2, (ADDR)      //Load R2 indirect from ADDR
50          $ADDD   R1, R2          //Add double precision (in software)
100         $DIVD   R1, Constant1   //Divide double precision (in software)
1           INC     ADDR            //Increment ADDR1
1           LD      (ADDR), R1      //Store R1 to indirect to ADDR
1           INC     i               //Increment i
1           JMP     Loop            //Loop
1   Done:   RET                     //Return
            •
            •
            •
    Run-time call
            •
            •
            •
1           PSH     PC              //Return address
1           PSH     &a              //Address of array a
1           PSH     1               //Push argument onto stack
1           PSH     50              //Push argument onto stack
1           PSH     2.0             //Push argument onto stack
1           CALL    Foo             //Subroutine Call
```

```
//Initialization
Cycles

1         LD    R1, VLIW_Code          //Memory location for VLIW Code
1         LD    R2, Size               //Size of VLIW Code //Load the VLIW microcode to the coprocessor 1         OUT, PAC1_Control_Instruction_Begin, PAC_IRAM_ADDR
1         OUT, PAC1_Control_Instruction_Size, Size
1  Loop:  DEC   R2
1         JLTZ  Done                   //Exit when transfer is complete
1         OUT   PAC1_data, (R1)        //A word of VLIW code
          JMP   Loop
              ·
              ·                                         ↖ 106
              ·
//Other Code ...
              ·
              ·                                         ↙ 107
              ·
//Run-time Function call
//Function foo is implemented by MACRO1 on PAC1

1         OUT   PAC1_Control_M1, MACRO1_Start   //To start
1         OUT   PAC1_Control_M1, 2              //Download argument
1         OUT   PAC1_Control_M1, 50             //Download argument
1         OUT   PAC1_Control_M1, 2.0            //Download argument
1         OUT   PAC1_Control_M1, 0              //Download a[0]
50        DMA   BASEA+1, 50                     //DMA to dump array at
                                                //the given address
1         OUT   PAC1_Control_M2, MACRO2_Start   //Off load array
1         OUT   PAC1_Control_M2, BASEA          //To start DMA
50        WAIT  PAC1                            //Wait on Interrupt PAC1
```

Cycle

FIG. 11

```
            //MACRO1
     ┌  Route (DB, P),           //Store Start
  1 ─┤   Write (R2);              //      "
     └
     ┌  Route (DB, S),           //Store End
  1 ─┤   Write (R3);              //      "
     └
     ┌  Route (DB, U),           //Store 2.0
  1 ─┤   Write (R4);              //      "
     └
     ┌  Route (DB, H),           //Store a[0]
     │  Write (R6),               //      "
     │  Route (R, K),            //Initialize i in R5
     │  Write (R5),               //      "
  1 ─┤  Route (R, X),            //Return if start > end
     │  Route (T, Y),             //      "
     │  Compare_GT (CMP),         //      "
     │  RET (Z);                  //      "
     └

┌ Loop: Route (DB, A),      //a[i]
     │       Route (C, B),       //a[i-1]
     │       ADD(ALU),           //Perform + on ALU (a[i] + a[i-1])
     │       Route (D, F),
     │       Route (V, E),       //2.0
     │       Divide(DIV),        //Perform / on DIV (a[i] + a[i-1])/2.0
     │
     │       Route (G, J),       //Store the result into on-chip RAM
     │       Route (L, I),       //         "
     │       Write (RAM),        //         "
     │
  1 ─┤       Route (G, H),       //a[i-1] = a[i] for next iteration
     │       Write (R6),         //         "
     │
     │       Route (L, M),       //i++
     │       Increment (Inc),    //i++
     │       Route (N, K),       //i++
     │       Write (R5),         //i++
     │
     │       Route (T, Y),       //i <= end for next iteration
     │       Route (N, X),       //         "
     │       Compare_GT (CMP),   //         "
     └       LOOP_OR_RET (Z, Loop); //If Z loop return otherwise
                    •
                    •
                    •
            //MACRO2 is similar ....
```

METHOD FOR DESIGNING A PRODUCT HAVING HARDWARE AND SOFTWARE COMPONENTS AND PRODUCT THEREFOR

BACKGROUND OF THE INVENTION

The present invention relates, in general, to system architectures, and more particularly, to system architectures having a host processor and a coprocessor.

Computing systems are typically designed to perform tasks such as, for example, mathematical calculations, signal processing, and systems level control in a rapid and cost efficient manner. Thus, computing system designers strive to optimize the number and performance of the individual components in the computing system. One technique for improving the performance of a computing system is to increase the operating speed of its primary component: the microprocessor. Although this technique improves performance, it increases the power consumption of the computing system and requires the use of additional components for heat removal.

Another technique for increasing the speed of the computing system is to use coprocessors to perform such tasks as complex mathematical calculations, i.e., "number crunching". However, this approach requires additional coprocessors and software that must be custom designed for each new application. The design of custom coprocessors incurs additional costs for hardware and software design and delays introduction of the computing system to the market, i.e., this technique increases the cycle time for manufacturing the computing system, resulting in a loss of market share.

Accordingly, it would be advantageous to have a computing system architecture and a method for designing the computing system architecture that eliminates designing custom coprocessors for each new system application. It would be of further advantage for the method to include designing both hardware and software components for the computing system, wherein the cost and cycle time for manufacturing the computing system are decreased.

DETAILED DESCRIPTION OF THE DRAWINGS

Generally, the present invention provides a product such as, for example, a computing system, and a method for designing the product, wherein the method includes both hardware and software components. More particularly, the computing system comprises a processor or microprocessor and at least one programmable coprocessor which has a predetermined architectural style. The processor is also referred to as a host processor. The programmable coprocessor is selected from a library of programmable coprocessors having the predetermined architectural style. It should be noted that the predetermined architectural style of the programmable coprocessor is further described with reference to FIG. 5. The combination of the host processor and the programmable coprocessor increases the execution speed of the computing system. In addition, the present invention provides a means for performing a cost performance comparison for a particular computing system architecture.

In accordance with the method of the present invention, the desired number of programmable coprocessors is selected from the library of programmable coprocessors and, together with software application code, is compiled using a software compiler. The compiler reads in the architecture of the programmable coprocessors and generates software code for initializing or programming the programmable coprocessors, loading data onto storage devices of the programmable coprocessors, starting the programmable coprocessors, and reading results back from the programmable coprocessors. In addition, the cost and performance of a particular architecture can be extracted from the number of components and the execution speed of the computing system, respectively. If the cost and/or performance does not fall within a specified acceptance level, the programmable coprocessor selection can be changed, i.e., a different number of programmable coprocessors or different types of programmable coprocessors are selected from the library of programmable coprocessors. The acceptance level is also referred to as an acceptance criteria or acceptance index. It should be understood that the number and types of programmable coprocessors used in the computing system is not a limitation of the present invention. This process is continued until the performance and cost of the combination of the host processor and the selected programmable coprocessor or coprocessors meets the acceptance criteria.

For example, assume a design is specified to have a cost of less than $50.00 per unit and an execution time, i.e., the performance, of less than 100 clock cycles. In other words, the acceptance criteria is that the system cost less than $50.00 and the execution time be less than 100 clock cycles. For a first configuration, comprising a host processor and a single programmable coprocessor of a first type, the cost is $40.00 and the execution time is 110 clock cycles. Since the first configuration does not fall within the limits of the design specification, a second configuration is generated which comprises the host processor, a programmable coprocessor of a second type, and a programmable coprocessor of a third type. The cost of the second configuration is $49.00 per unit and the execution time is 90 clock cycles. The cost and performance of the second configuration falls within the acceptance criteria, thus it represents a viable design option.

In accordance with a first embodiment of the present invention (illustrated in FIG. 1), a computing system 10 includes a host processor 11 and two programmable coprocessors 12 and 13 configured in a closed system. Programmable coprocessors 12 and 13 are used to perform various processing tasks such as, for example, calculations for host processor 11. The results of the calculations are transferred to host processor 11 for further processing. Thus, the operating speed of a software application running on host processor 11 is increased by using one or more programmable coprocessors to perform selected tasks or operations. It should be noted that in a closed system, programmable coprocessors 12 and 13 receive instructions and data from host processor 11, perform data processing operations on the received data and pass the results of the data processing steps back to host processor 11. It should be further noted that the number of programmable coprocessors is not a limitation of the present invention.

Figure 2:
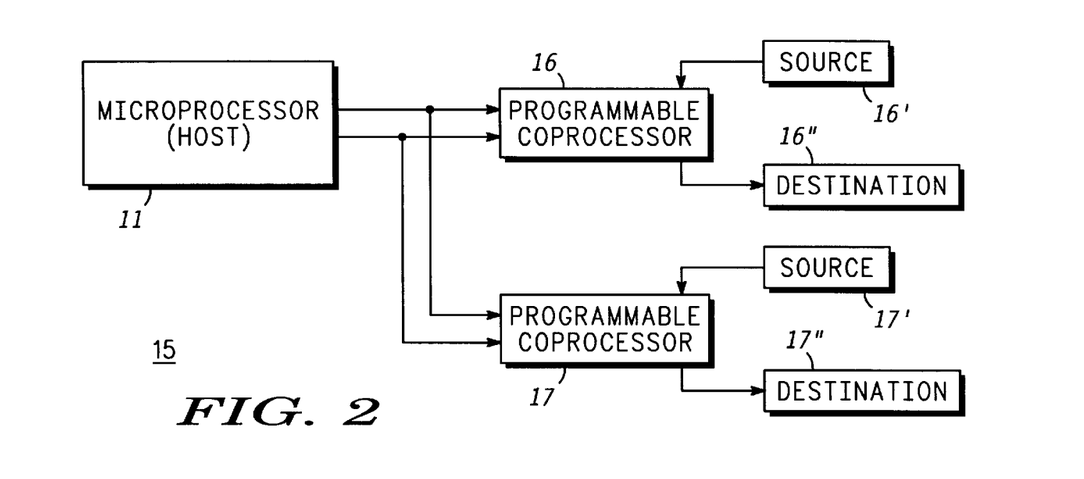
FIG. 2 illustrate a block diagram of a computing system in accordance with a second embodiment of the present invention.

FIG. 2 illustrates a computing system in accordance with a second embodiment of the present invention. What is shown in FIG. 2 is a computing system 15 comprising a host processor 11 and programmable coprocessors 16 and 17 configured in an open system. In an open system, a host processor configures a selected programmable coprocessor to perform a task such as for example, point-to-point filtering, data compression, or data encryption, independent of host processor 11. Thus, selected programmable coprocessor 16 receives data from a source 16' external to host processor 11, processes the data, and transfers the results of the data processing to a destination 16" external to host processor 11. Likewise, selected programmable coprocessor 17 receives data from a source 17' external to host processor 11, processes the data, and transfers the results of the data processing to a destination 17" external to host processor 11. Examples of sources 16' and 17' and destinations 16" and 17" include memory locations, other processors, other coprocessors, etc. It should be understood that the same reference numerals are used in the figures to denote the same elements.

Figure 1:
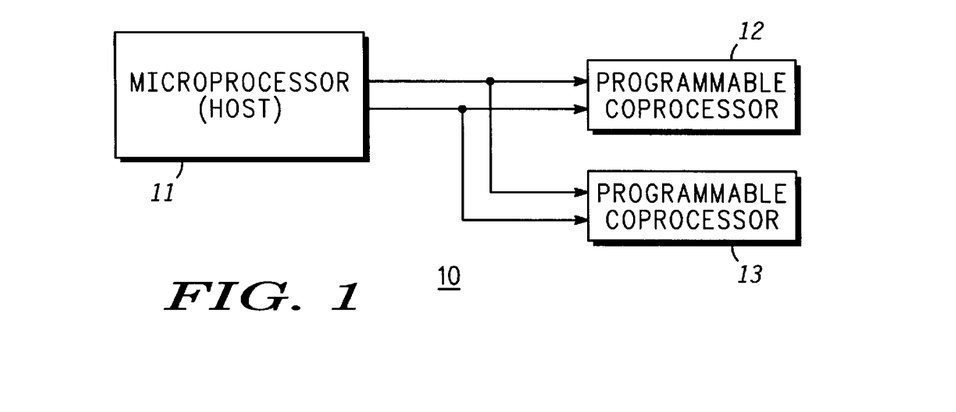
FIG. 1 illustrates a block diagram of a computing system in accordance with a first embodiment of the present invention.
Figure 3:
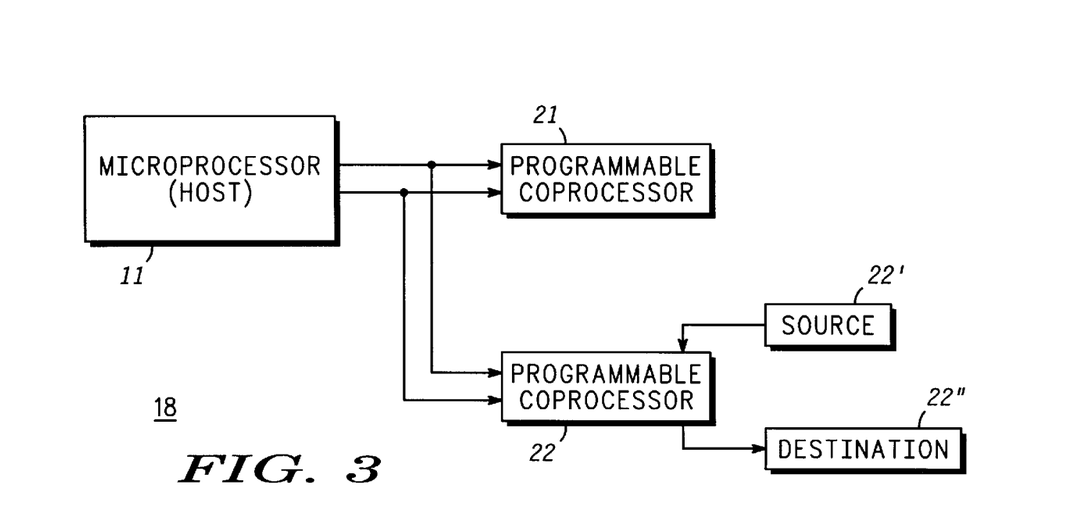
FIG. 3 illustrates a block diagram of a computing system in accordance with a third embodiment of the present invention.

FIG. 3 illustrates a computing system in accordance with a third embodiment of the present invention. What is shown in FIG. 3 is a computing system 18 comprising a programmable coprocessor 21 configured in a closed system and a programmable coprocessor 22 configured in an open system. When programmable coprocessor 21 is operating, it receives data from host processor 11, processes the data and transfers the results back to host processor 11. When programmable coprocessor 22 is operating, it receives data from a source 22' external to host processor 11, processes the data, and transfers the results of the data processing to a destination 22" external to host processor 11. It should be understood that the number of programmable coprocessors in each of the embodiments illustrated in FIGS. 1–3 is not a limitation of the present invention. In other words, there may be one or more programmable coprocessors in each of the embodiments. Further, although single sources and destinations are shown in FIGS. 2 and 3, it understood that the number of sources and destinations coupled to a particular programmable coprocessor is not a limitation of the present invention. Thus, there may be multiple sources and destinations coupled to a particular programmable coprocessor.

Figure 4:
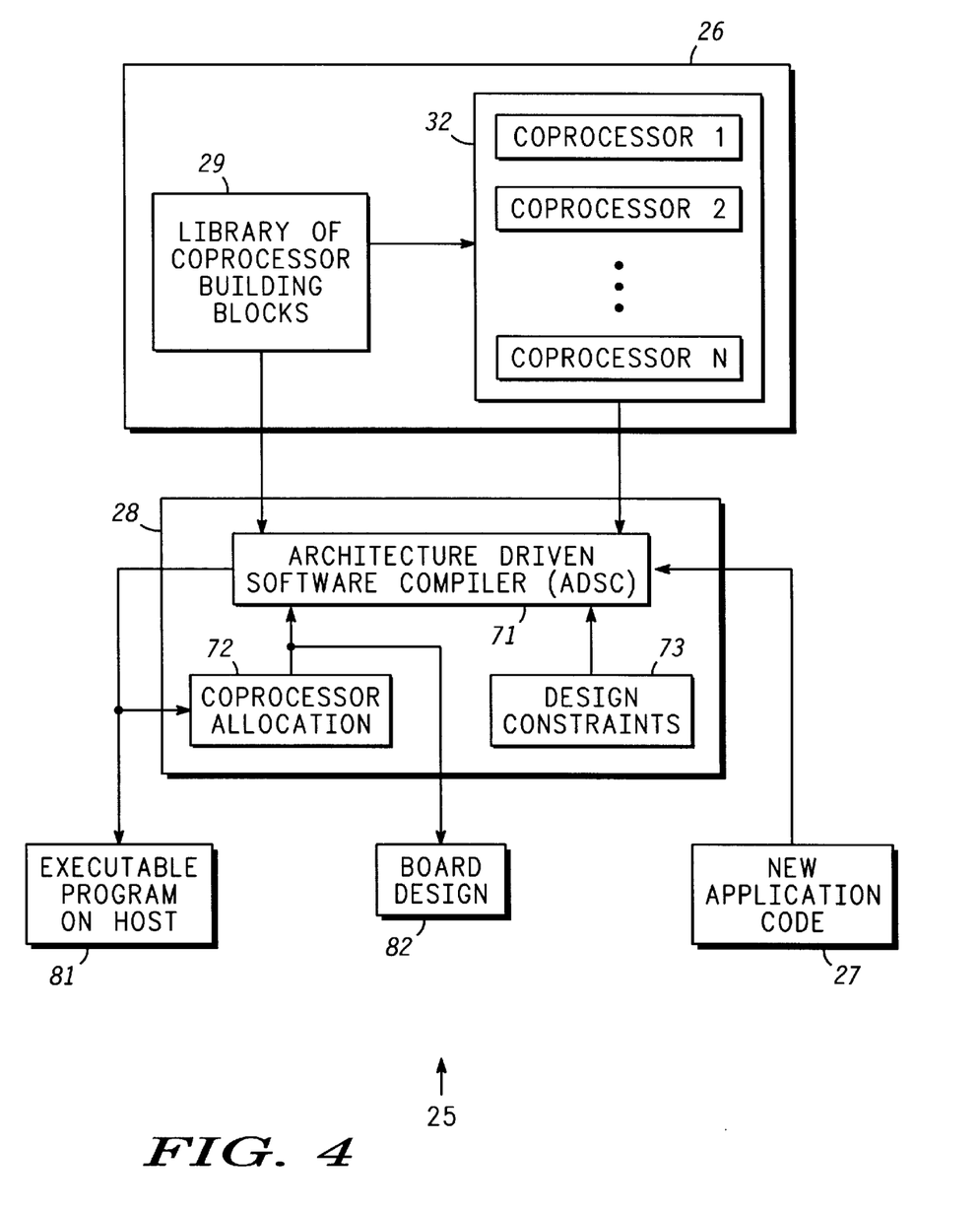
FIG. 4 illustrates a block diagram of a methodology for designing a computing system in accordance with the present invention.

FIG. 4 illustrates a block diagram 25 of a methodology for designing computing systems such as computing systems 10, 15, and 18 of FIGS. 1, 2, and 3, respectively. What is shown in FIG. 4 is a process in which three design phases are combined into a single design methodology for designing a computing system. The three design phases are comprised of a hardware design phase 26, a software design phase 27, and a hardware-software design phase 28. The hardware design phase 26 includes providing a library of coprocessor building blocks 29 and using components from the library of coprocessor building blocks 29 to form a library of programmable coprocessors 32. The library of coprocessor building blocks is also referred to as a library of coprocessor components. By way of example, library of coprocessor components 29 includes tri-state drivers, arithmetic logic units, sequencers, registers, register files, RAM's, multiplexers, interconnection networks, and the like.

Components from library of coprocessor components 29 are used to construct a variety of coprocessors which collectively form a library of coprocessors 32, wherein each coprocessor in the library of coprocessors 32 has the same architectural style. For example, coprocessor 1 may include a sequencer, a programmable interconnection network, two adders, three multipliers, and five registers; coprocessor 2 may include a sequencer, a programmable interconnection network, one adder, two multipliers, and ten registers; and coprocessor N may include a sequencer, a programmable interconnection network, one adder, one multiplier, and five registers. It should be noted that the number of coprocessors included in library of coprocessors 32 is not a limitation of the present invention. Thus, the variable "N" is used to indicate that the library of coprocessors contains one or more coprocessors, wherein "N" represents an integer number. In addition, a netlist representation of each coprocessor in the library of coprocessors is also provided. The netlist representation is used by a compiler during hardware-software design phase 28.

Figure 5:
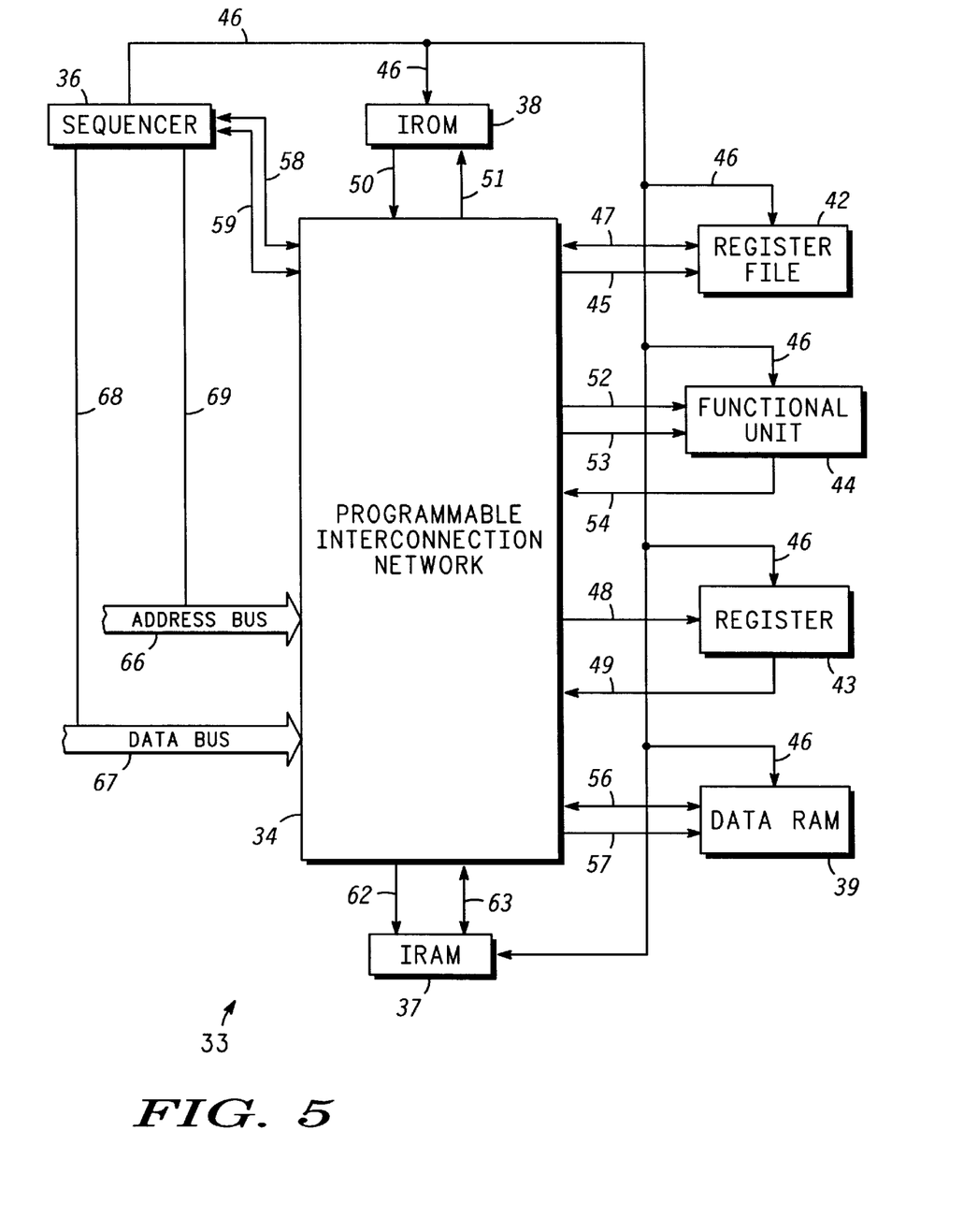
FIG. 5 illustrates a programmable coprocessor having an architectural style in accordance with an embodiment of the present invention.

Although each coprocessor of library of coprocessors 32 may be different, it should be understood that each coprocessor has a predetermined architectural style. More particularly, each coprocessor includes a sequencer and an interconnection network, thus each coprocessor has a similar architectural style. FIG. 5 illustrates a programmable coprocessor 33 having an architectural style in accordance with the present invention. It should be noted that since functional units, registers, RAM's, ROM's, register files, the interconnection network, etc. is programmable by loading instructions into the coprocessor, the coprocessor is referred to as a programmable coprocessor and the library of coprocessors is referred to as a library of programmable coprocessors. Programmable coprocessor 33 includes a programmable interconnection network 34, a sequencer 36, an instruction RAM 37, also referred to as IRAM 37, an instruction ROM 38, also referred to as IROM 38, a data RAM 39, a register file 42, a register 43, and a functional unit 44. Suitable components for functional unit 44 include arithmetic logic units (ALU), dividers, comparators, adders, etc.

Interconnection network 34 is a programmable interconnection network that is controlled by sequencer 36 and is provided as a netlist of internal components such as, for example, multiplexers and tri-state drivers that are derived from library of building blocks 29 (FIG. 4). The multiplexers and tri-state buffers are configured to route data between specified input and output ports of programmable interconnection network 34. By way of example, register file 42, register 43, functional unit 44, IRAM 37, IROM 38, and data RAM 39 are coupled to programmable interconnection network 34. The multiplexers and tri-state buffers of programmable interconnection network 34 are configured to route data from data bus 67 to selected register files, functional units, and registers. In addition, the multiplexers and tri-state buffers are configured to route data from address bus 66 to IRAM 37 and IROM 38. An advantage of using a programmable interconnection network is that the internal components, i.e., the multiplexers, tri-state buffers, etc., of programmable interconnection network 34 are configured so that several interconnect paths may be used simultaneously, thereby decreasing the cost of the coprocessor. However, it should be understood that the type of interconnection network is not a limitation of the present invention. In other words, fully interconnected programmable networks such as cross-bar switches may be used to route information from one point to another point.

Sequencer 36 is connected to programmable interconnection network 34 via a control signal line 46, i.e., an enable signal line, and via bidirectional busses 58 and 59. In addition, sequencer 36 is coupled to register file 42, register 43, functional unit 44, IRAM 37, IROM 38, and data RAM 54 via enable signal line 46. Sequencer 36 is also coupled to an external address bus 66 via signal line 68 and to an external data bus 67 via signal line 69. Thus, sequencer 36 provides control signals to the components of programmable coprocessor 33. By way of example, sequencer 36 has a very long instruction word (VLIW) architecture that provides a simple control mechanism and is capable of interpreting fields for performing functions such as addition, multiplication, writing to registers, etc. In addition, sequencer 36 has its own program counter and is capable of performing jump or conditional go-to steps, subroutine call, return steps, and looping steps. Further, sequencer 36 includes decoding logic to control register files, registers, functional units, IRAM's, IROM's, data ROM's, programmable interconnection networks, etc.

Register file 42 is coupled to programmable interconnection network 34 via address bus 45 and bidirectional data bus 47. Register 43 is coupled to programmable interconnection network 34 via an input data bus 48 and an output data bus 49. Input ports of functional unit 44 are coupled to programmable interconnection network 34 via input data busses 52 and 53 and an output data bus 54. Data RAM 39 is coupled to programmable interconnection network 34 via a bidirectional address bus 56 and a data bus 57. IRAM 37 is coupled to programmable interconnection network 34 via busses 62 and 63. IROM 38 is connected to programmable interconnection network 34 via data and address connections 50 and 51, respectively.

Thus, one example of a programmable coprocessor having the predetermined architecture in accordance with the present invention is illustrated in FIG. 5. It should be noted that single components from library of building blocks 29 (FIG. 4) have been illustrated to simplify the example of the coprocessor having the predetermined architecture, i.e., a single register file, a single function unit, and a single register are shown. It should be understood that the types and number of components of coprocessor 33 illustrated in FIG. 5 are not a limitation of the present invention. In other words, there may be one or more of each component, i.e., one or more register files 42, one or more registers 43, one or more functional units 44, etc. It should be further noted that a more detailed representation of a coprocessor architecture is illustrated and further described with reference to FIG. 7.

Referring again to FIG. 4, structural features such as, for example, sizes, arithmetic bit widths, functionality, and control structures for each element of library of building blocks 29 are also provided during hardware design phase 26. Further, a description of the components of library of building blocks 29 and performance parameters such as, for example, execution speed are also provided during design phase 26. Thus, elements from library of building blocks 29 are configured to form coprocessors having the same architectural style but which perform different functions. In other words, a library of programmable coprocessors 32 is designed using components from the library of coprocessor components 29. Each coprocessor is constructed as a simple netlist of building blocks but with a varying allocation of building blocks, varying sizes of RAM's, register files, etc. In addition, the architecture and timing characteristics of each building block is described. For example, an ALU having two input ports and one output port may be specified as performing multiplication in three clock cycles, addition in one clock cycle, and an add-shift operation in one clock cycle.

During hardware design phase 26, a hardware description language (HDL) description is generated for each coprocessor in the library of programmable coprocessors, i.e., an HDL description is generated for coprocessor 1, a different HDL description is generated for coprocessor 2, and yet another different HDL description is generated for coprocessor "N". Thus, a unique HDL description is generated for each coprocessor in the library of programmable coprocessors 32. Typically, library of coprocessor components 29, the library of programmable coprocessors 32, and the HDL descriptions are generated at the foundry at which the coprocessors are manufactured.

Figure 8:
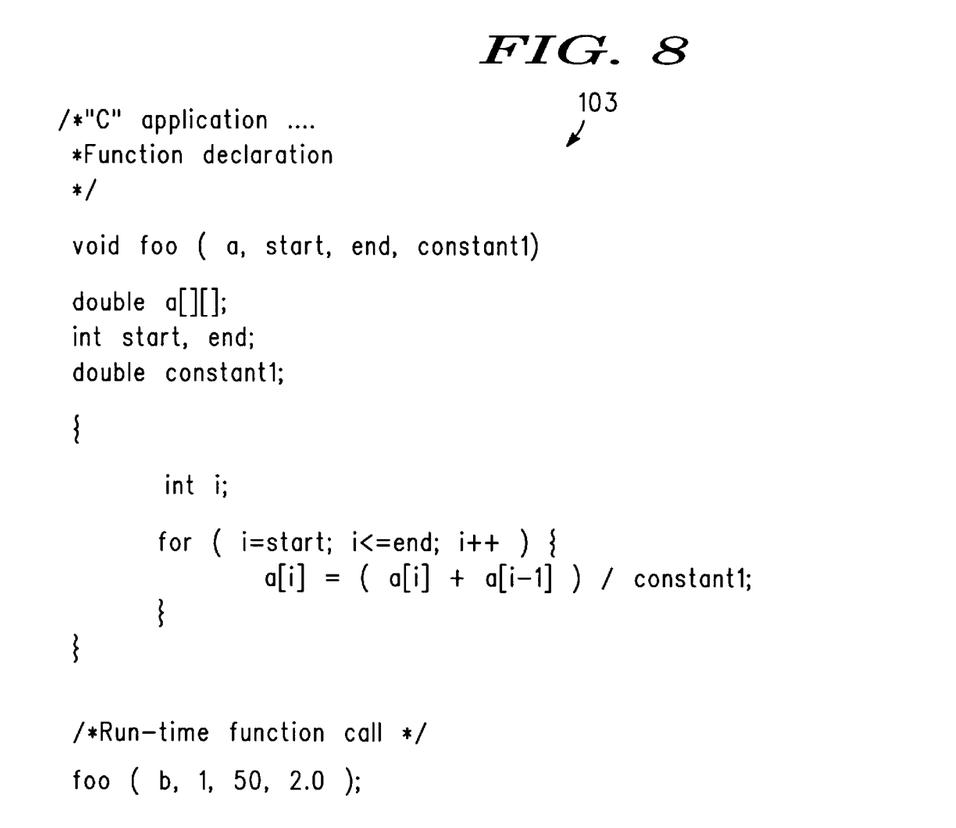

Still referring to FIG. 4, the software design phase 27 includes generating application software code in, for example, a high level language such as the "C" programming language. It should be noted that application software code is also referred to as software application code or a software application program. Other suitable programming languages in which the application software code can be generated include Pascal, C++, ADA, etc. The application software code specifies the tasks that each element performs. An example of a suitable application code is shown in FIG. 8.

Still referring to FIG. 4, the hardware-software co-design phase 28 is shown which includes using a software compiler 71, a coprocessor allocation scheme 72, and a set of design constraints 73. It should be noted that coprocessor allocation scheme 72 may be included with compiler 71 or be separate from compiler 71 and specified by an end user. In other words, coprocessor allocation 72 may be accomplished by programming compiler 71 to choose components from the library of programmable coprocessors or the coprocessors may be directly allocated by the user. Compiler 71 generates an assembly code for a computing system using the allocated coprocessors and the host processor. In other words, a program that is executable on a host processor is generated and is illustrated by reference numeral 81. Since the number and configurations of the coprocessors has been determined, a board level design can also be performed as indicated by reference numeral 82.

Figure 6:
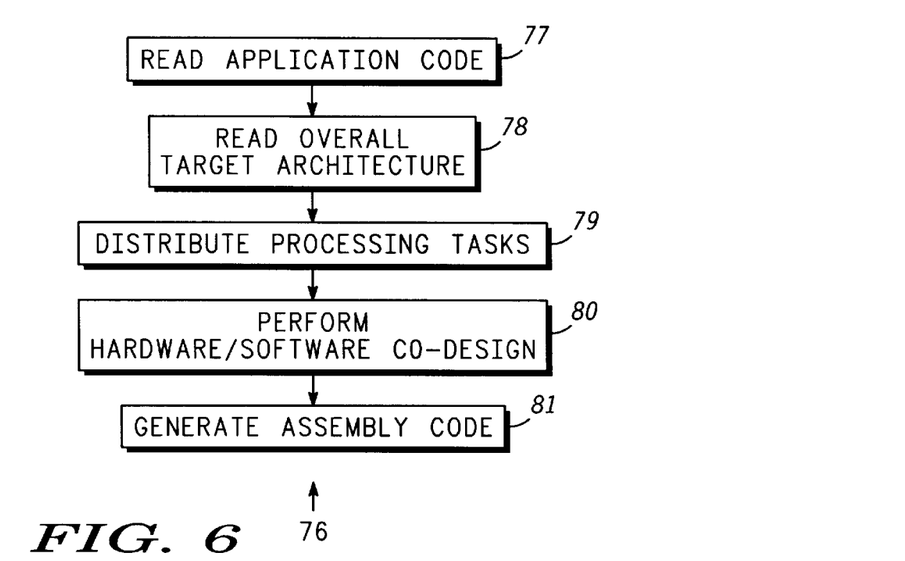
FIG. 6 illustrates a flow diagram illustrating a sequence of steps performed by a compiler in accordance with the present invention.

Now referring to FIG. 6, a flow diagram 76 illustrating the sequence of steps performed by compiler 71 is illustrated. In a first step 77, software compiler 71 accesses, i.e., "reads-in", the high level application code generated during software design phase 27. In a second step 78, compiler 71 "reads-in" an overall target architecture, i.e., the allocation of coprocessors. In addition, compiler 71 "reads-in" library of coprocessor building blocks 29 (described with reference to FIG. 1) and the microarchitecture of each coprocessor type, i.e., the netlist of programmable coprocessors, the netlist of the components or building blocks of each coprocessor, the execution speeds of the components of each coprocessor, etc. In other words, when the compiler reads in the netlist representation of each coprocessor, it examines the building blocks in the coprocessor and how they are connected, thereby identifying the functions that can be performed on the coprocessor. Once the compiler understands the number and types of components that are present, it determines how to create VLIW code to execute a particular function on the coprocessor. Thus, the compiler extracts the functionality of each coprocessor from the netlist representation. In a third step 79, compiler 71 identifies which segments of the application code, e.g., the routine function, can be performed on the allocated programmable coprocessors. In other words, compiler 71 identifies segments of the application code that can be parallelized and distributes the processing tasks. In a fourth step 80, compiler 71 performs the hardware-software co-design. More particularly, compiler 71 generates "native" code for each function, generates microcode for each candidate function on each coprocessor which can implement the function, determines the best assignments of functions to processors by trading off speed, coprocessor microcode RAM space, host program size, etc. Thus, compiler 71 is referred to as an architecture driven software compiler. In a fifth step 81, compiler 71 generates a software program which is executable on host microprocessor 11. More particularly, compiler 71 generates the software program by generating a host microprocessor code from the a portion of the parallelized application software code, generates a coprocessor code from the portion of the application software code that is parallelized, uses the host microprocessor code to determine the execution speed of the host microprocessor, uses the coprocessor code to determine the execution speed of the coprocessor, selects one of the host microprocessor or the coprocessor for execution of the portion of the application software code that is parallelized, and creates a code which serves as the software program. By way of example, the executable software program is assembly code which performs such tasks as coprocessor initialization, run-time coprocessor interface, and bi-directional data down loading.

FIGS. 7–11 illustrate an example of the methodology for designing a computing system in accordance with the present invention. For the purposes of the example, a single programmable coprocessor 86 is allocated from the library of programmable coprocessors 32 (FIG. 4) and illustrated in FIG. 7. Since programmable coprocessor 86 is an element of library of programmable coprocessors 32, a netlist for programmable coprocessor 86 and descriptions for the building blocks or components of library of building blocks 29 are made available to compiler 71. In addition, the computational speeds of each component of library of building blocks 29 are made available to compiler 71.

Figure 7:
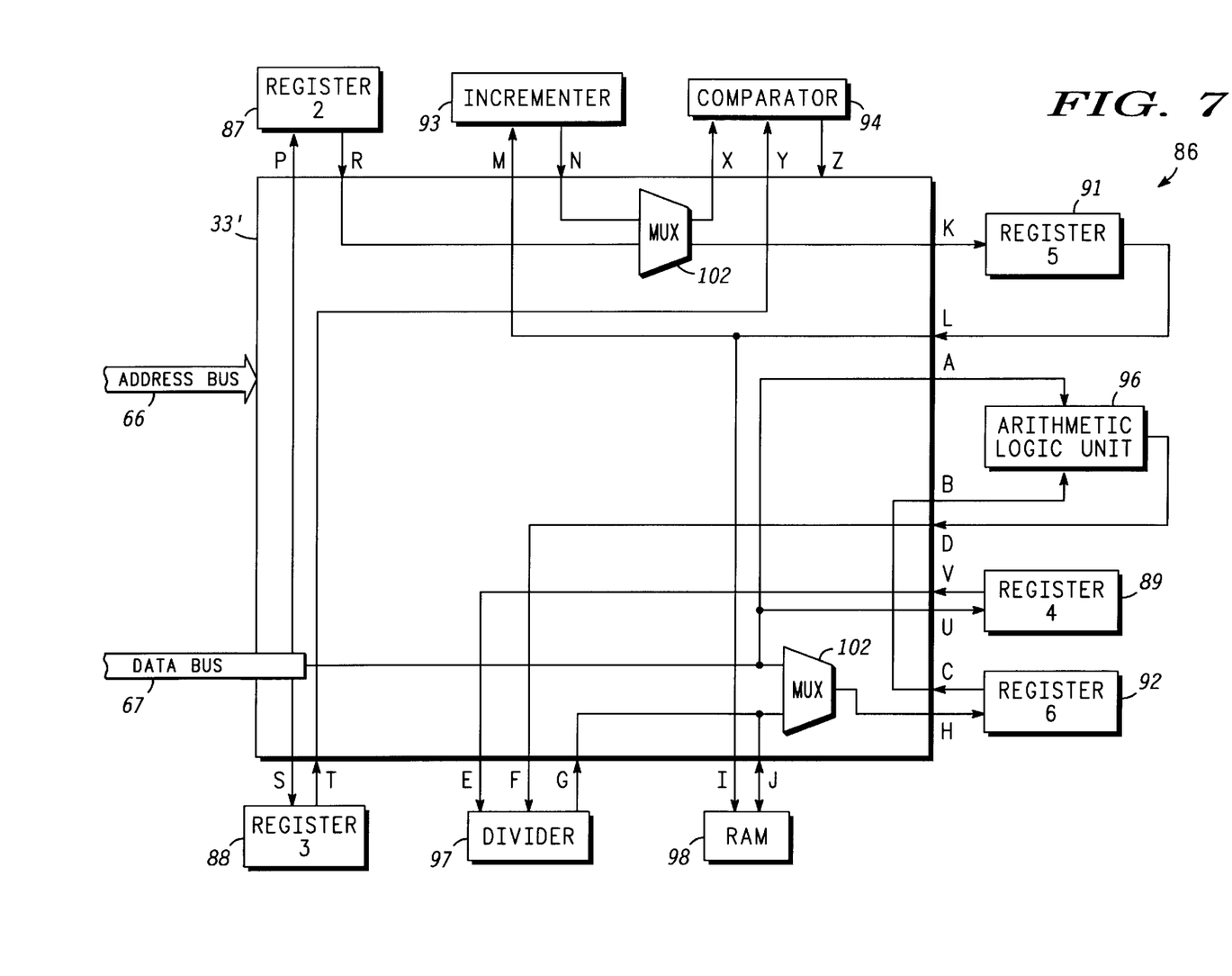
FIGS. 7–11 illustrate an example of the methodology for designing a computing system in accordance with the present invention.

Programmable coprocessor 86 comprises a programmable interconnection network 33' and registers 87, 88, 89, 91, and 92 which are labeled "REGISTER 2", "REGISTER 3", "REGISTER 4", "REGISTER 5", and "REGISTER 6", respectively. Programmable coprocessor 86 further comprises an incrementing circuit or incrementer 93, a comparator 94, an ALU 96, a divider 97, a data RAM 98, external address bus 66, external data bus 67, and a plurality of multiplexers 102. It should be understood that only a portion of the internal components and interconnections of programmable interconnection network 33' is shown in FIG. 7 and the portion merely serves to illustrate an implementation of interconnection network 33'. It should be further understood that a prime (') has been added to the reference numeral 33 to distinguish programmable interconnection network 33' of FIG. 7 from the more general version of programmable interconnection network 33 shown in FIG. 4.

In operation, compiler 71 "reads-in" the application code for the particular application. An example of an application code 103 is illustrated in FIG. 8. Application code 103 includes a function "foo" and a definition of the function. As those skilled in the art will understand, application code 103 is an example of a simplified digital signal processing function. Compiler 71 determines the execution speed for the host processor (e.g., host processor 11 described with reference to FIGS. 1–3) to perform the operation described by application code 103. More particularly, compiler 71 determines the number of clock cycles the host processor uses to perform the instructions specified by application code 103.

Figure 9:
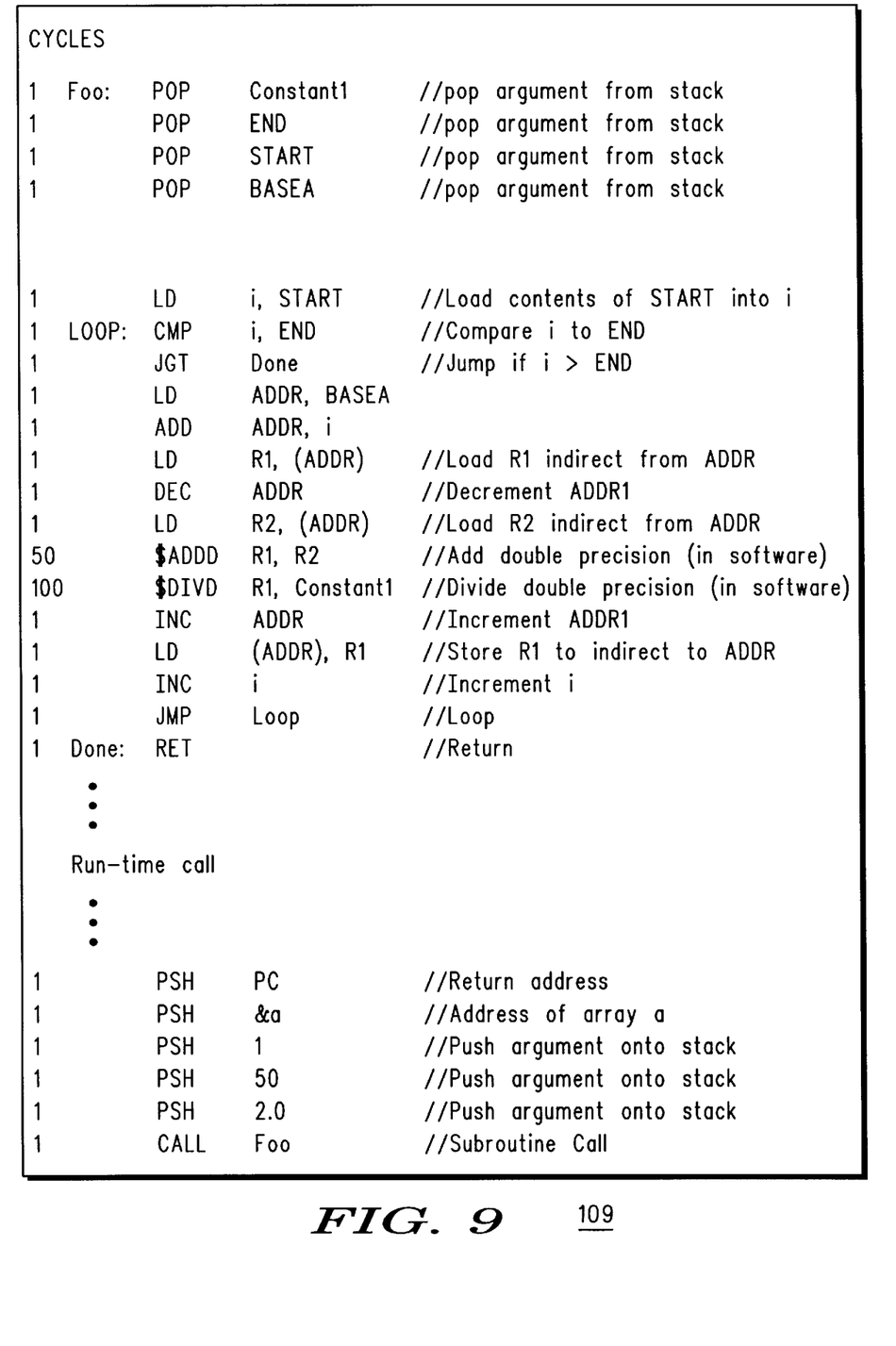

FIG. 9 illustrates an example of a pseudo-assembly code and the number of clock cycles for performing the instructions specified by application code 103 in the absence of coprocessor 86. Although the number of clock cycles is included, it should be understood that this information in not part of the pseudo-assembly code but is provided to allow a comparison of the number of clock cycles for a design using the present invention, thereby illustrating the reduction in the number of clock cycles achieved when designing computing systems in accordance with the present invention. It should be noted that the number of clock cycles was determined with the assumption that the host processor does not have floating point hardware, all integer instructions take a single clock cycle, and that double precision addition and division operations take 50 and 100 clock cycles, respectively. As those skilled in the art will understand, passing the arguments, i.e., constants, beginning values, ending values, etc., to the subroutine "foo" takes 5 clock cycles. In addition, looping through the simplified digital signal processing function takes 161 clock cycles, returning the result to the application takes 1 clock cycle, and returning to the application code takes 6 clock cycles. Thus, for an array having 50 elements, the host processor performs the instructions specified by application code 103 in 8,062 clock cycles. In other words, a first performance index is determined which indicates the application code takes 8,062 clock cycles when only a host processor is used in the computing system design.

After determining the number of cycles that the host processor uses to perform the instructions specified in application code 103, compiler 71 determines the number of clock cycles that the combination of the host processor and coprocessor 86 use to perform the instructions specified by application code 103. In other words, the compiler maps the application code into programmable coprocessor 86. In a first step (shown in FIG. 10), the compiler creates computer code for execution on the host processor. In a second step (shown in FIG. 11), the compiler creates VLIW code to run on programmable coprocessor 86. It should be noted that the VLIW microcode illustrated in FIG. 11 is comprised of a macro, called MACRO1, that downloads data to programmable coprocessor 86 and to the digital signal processing algorithm in parallel. In a third step, MACRO2 sends the results of the computation back to the host processor. Programming code for sending computational results to a host processor such as, for example, MACRO2, is well known to those skilled in the art and thus the programming code for MACRO2 is not shown. It should be further noted that the terms VLIW code and VLIW microcode are used interchangeably.

Figure 10:
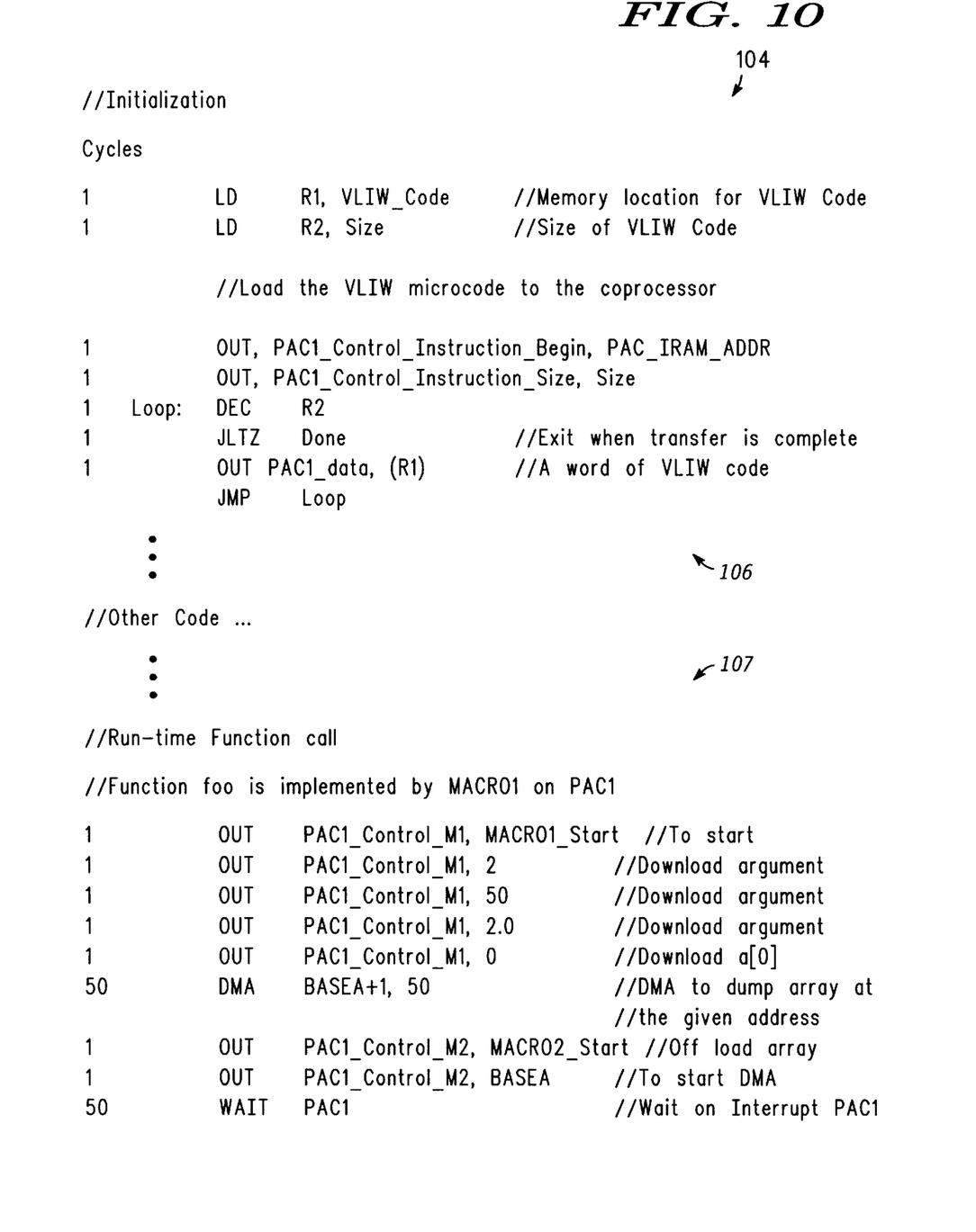
Figure 11:
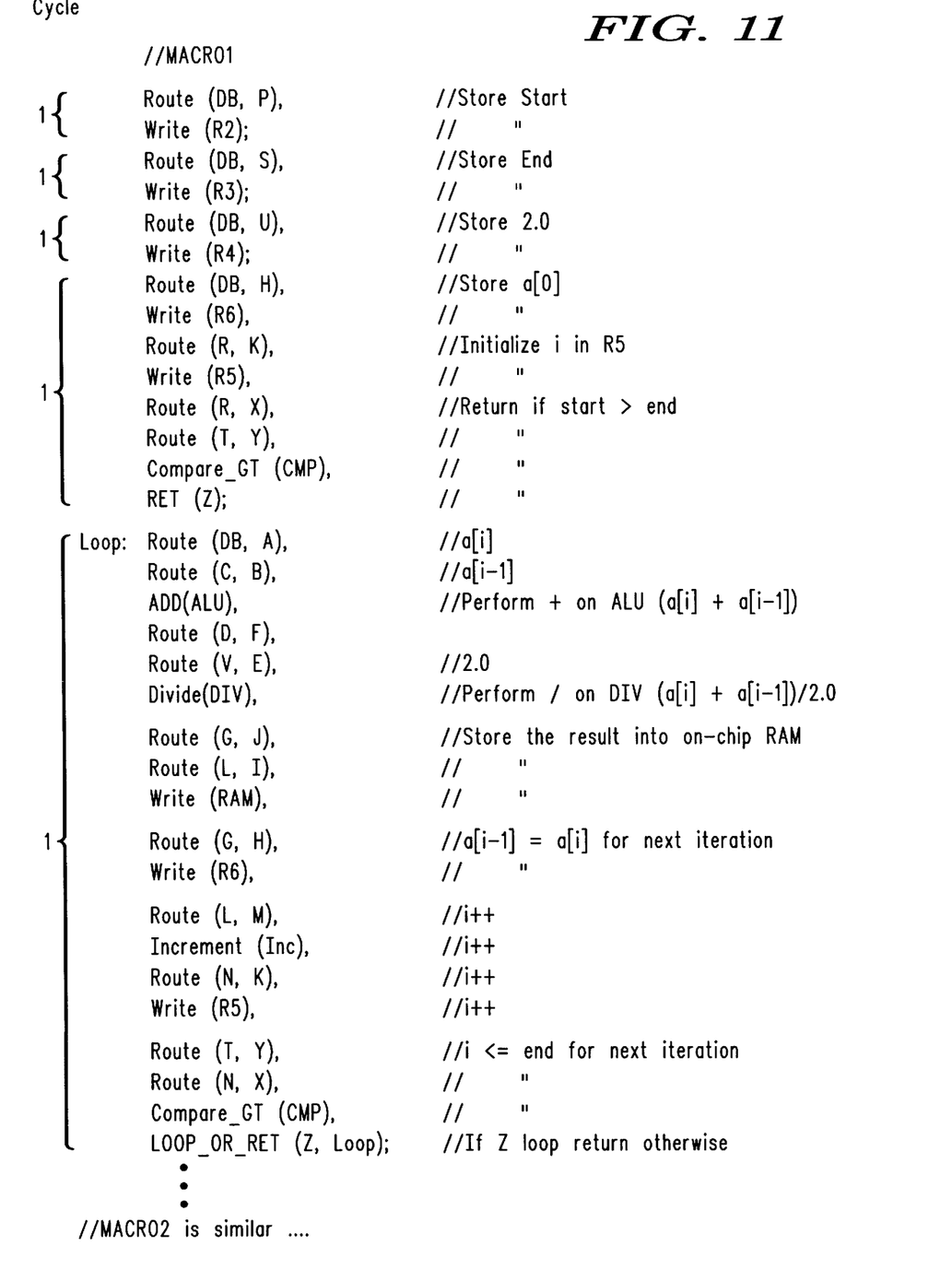

FIG. 10 illustrates a pseudo-assembly code 104 for mapping or loading application code 103 from the host processor to programmable coprocessor 86. As those skilled in the art will understand, an initialization cycle 106 is performed wherein the host processor loads the VLIW code into coprocessor 86, i.e., host processor 11 reserves memory locations in coprocessor 86 and loads the VLIW microcode into the IRAM of coprocessor 86. Initialization step 106 is executed once, thus its effect on the overall run time can be ignored. The run time of the initialization step 106 is proportional to the size of the VLIW code, thus the longer the VLIW code, the longer the run time.

After completion of initialization step 106, the function "foo" is implemented at step 107. Thus, programmable coprocessor 86 is started by application code 107. More particularly, a first macro, labeled MACRO1 and identified by reference numeral 109 in FIG. 11, is executed. MACRO1 is a VLIW code that calculates the average of an array of numbers and stores the results in an array. Referring again to step 107 of FIG. 10, a first direct memory access (DMA) step is started to transfer the array to programmable coprocessor 86. The programmable coprocessor 86 starts processing the data before the data transfer is complete. When the processing is complete MACRO2 is executed to transfer the array of values back to the host processor.

It should be understood that VLIW instructions execute one or more microinstructions simultaneously. The VLIW code in FIG. 11 is written with a coding convention such that parallel activities performed within one VLIW instruction are separated by a comma and VLIW instructions which are not executed in parallel are separated by a semicolon. The execution speed of MACRO1 shown in FIG. 11 is very fast since a large number of micro-instructions can be performed in parallel. The execution of the two DMA steps uses 100 clock cycles, i.e., 50 clock cycles for each DMA step. In addition, 7 clock cycles are used for transferring arguments between the host processor and programmable coprocessor 86, and starting the DMA steps. Thus, for an array having 50 elements, programmable coprocessor 86 performs the instructions specified by application code 103 in 107 clock cycles. On the other hand, the data is processed in 8,062 clock cycles when using just the host processor. In other words, the processing speed is increased by approximately 80 times when using coprocessors in accordance with the present invention. In other words, a second performance index is determined which indicates the application code only uses 107 clock cycles when a host processor and a programmable coprocessor are used in the computing system design.

It should be understood that the number of clock cycles represents an amount of time for running the application code. Thus, the number of cycles of the first performance index represents a first amount of time and the number of cycles of the second performance index represents a second amount of time. For a design where it is desirable to optimize the amount of time, the design having the second performance index, i.e., the lesser of the amount of time, is selected.

By now it should be appreciated that a computing system and a method for designing the computing system have been provided. In accordance with the present invention, a library of programmable coprocessors is designed wherein each programmable coprocessor of the library of programmable coprocessors has the same architectural style. Thus, a compiler can optimize the execution speed of the computing system by "reading-in" the architecture of each programmable coprocessor type and selecting the number and types of programmable coprocessors to operate in conjunction with a host processor. An advantage of the present invention is that the coprocessors are programmable and versatile, and a new coprocessor design is not required for new applications. Further, since the coprocessors can be reused, the rate of obsolescence is decreased which allows time to optimize the processes for manufacturing the coprocessors. In addition, the design cycle time is shortened which in turn shortens the time to introduce new parts to market.

I claim:

1. A method for designing a product having hardware and software components, comprising the steps of:

providing a library of coprocessor components and a description of each coprocessor component in the library of coprocessor components;

providing a library of programmable coprocessors and a netlist representation of each programmable coprocessor in the library of programmable coprocessors comprised of the library of coprocessor components, wherein each programmable coprocessor of the library of programmable coprocessors has a uniform and predetermined architectural style;

extracting the functionality of each programmable coprocessor from the netlist representation;

providing a software application; and mapping the software application to a product, which product comprises a host microprocessor, at least one programmable coprocessor from the library of programmable coprocessors, and a software program, wherein the software program is:

executable on the host microprocessor;

programs the at least one programmable coprocessor from the library of programmable coprocessors to perform a function;

executes a portion of the software application on the host microprocessor; and dispatches a portion of the software application to one or more of the at least one programmable coprocessor.

2. The method of claim 1, wherein the step of mapping a software application to a product includes the steps of:

providing an architecture driven software compiler;

transmitting the description of each coprocessor component of the library of coprocessor components to the architecture driven software compiler;

transmitting the netlist representation of the at least one programmable coprocessor of the library of programmable coprocessors to the architecture driven software compiler;

providing an application software code for the architecture driven software compiler; and generating the software program which is executable on the host microprocessor using the architecture driven software compiler.

3. The method of claim 2, wherein the step of providing an application software code includes providing a high level software application code.

4. The method of claim 2, wherein the step of generating the software program which is executable on the host microprocessor includes the steps of:

parallelizing at least one portion of the application software code, wherein the step of parallelizing comprises the steps of:

generating a host microprocessor code from the at least one portion of the application software code that is parallelized;

generating a coprocessor code from the at least one portion of the application software code that is parallelized;

using the host microprocessor code to determine an execution speed of the host microprocessor;

using the coprocessor code to determine an execution speed of the at least one programmable coprocessor;

selecting one of the host microprocessor or the at least one programmable coprocessor for execution of the at least one portion of the application software code that is parallelized, wherein the one of the host microprocessor or the at least one programmable coprocessor is selected in accordance with their execution speeds; and creating a code which serves as the software program.

5. The method of claim 1, further including the steps of:

allocating a first plurality of programmable coprocessors from the library of programmable coprocessors;

providing a netlist representation of the first plurality of programmable coprocessors from the library of programmable coprocessors;

providing an acceptance index for the software program which is executable on the host microprocessor;

providing an architecture driven software compiler;

transmitting the description of each coprocessor component of the library of coprocessor components to the architecture driven software compiler;

transmitting the netlist representation of the first plurality of programmable coprocessors from the library of programmable coprocessors to the architecture driven software compiler;

providing an application software code for the architecture driven software compiler;

determining a first performance index, the first performance index for first plurality of programmable coprocessors from the library of programmable coprocessors;

comparing the first performance index with the acceptance index and generating a first comparison result; and generating the software program which is executable on the host microprocessor using the architecture driven software compiler in accordance with the first comparison result.

6. The method of claim 5, further including the steps of:

allocating a second plurality of programmable coprocessors from the library of programmable coprocessors;

providing a netlist representation of the second plurality of programmable coprocessors from the library of programmable coprocessors;

transmitting the netlist representation of the second plurality of programmable coprocessors from the library of programmable coprocessors to the architecture driven software compiler;

determining a second performance index, the second performance index for the second plurality of programmable coprocessors from the library of programmable coprocessors;

comparing the second performance index with the acceptance index and generating a second comparison result; and generating the software program which is executable on the host microprocessor using the architecture driven software compiler in accordance with the second comparison result.

7. The method of claim 1, wherein the software program controls execution of the dispatched portion of the software application on the at least one programmable coprocessor.

8. A method for designing a portion of a computing system, comprising the steps of:

providing a host microprocessor;

providing a plurality of programmable coprocessors and a netlist representation for each programmable coprocessor of the plurality of programmable coprocessors, wherein each programmable coprocessor of the plurality of programmable coprocessors has a predetermined architectural style;

providing a plurality of building blocks for the plurality of programmable coprocessors and a description for each of the plurality of building blocks for the plurality of programmable coprocessors;

extracting the functionality of each programmable coprocessor from the netlist representation;

allocating a first set of programmable coprocessors from the plurality of programmable coprocessors;

providing a software application code;

compiling the software application code with the host microprocessor and the first set of programmable coprocessors; and generating a first software program, wherein the first software program:
  is executable on the host microprocessor;
  programs at least one of the first set of programmable coprocessors;
  executes a portion of the software application on the host microprocessor; and
  dispatches a portion of the software application to at least one of the first set of programmable coprocessors.

9. The method of claim 8, wherein the step of providing a plurality of programmable coprocessors includes providing each of the plurality of programmable coprocessors with a sequencer and a programmable interconnection network as the predetermined architectural style.

10. The method of claim 8, wherein the step of compiling the software application code includes:

transmitting a netlist representation for the first set of programmable coprocessors to a compiler;

transmitting a description for the plurality of building blocks of the first set of programmable coprocessors to the compiler; and using the compiler to generate the first software program, where the first software program is executable on the host microprocessor.

11. The method of claim 8, wherein the step of compiling the software application code with the host microprocessor and the set of programmable coprocessors includes:

generating a first host microprocessor programming code from a portion of the software application code;

generating a first programmable coprocessor programming code from the portion of the software application code;

determining an amount of time the host microprocessor uses to run the first host microprocessor programming code;

determining an amount of time the first set of programmable coprocessors uses to run the first programmable coprocessor programming code; and selecting one of the host microprocessor or the first set of programmable coprocessors in accordance with the amount of time the host microprocessor uses to run the first host microprocessor programming code and the amount of time the set of programmable coprocessors uses to run the first programmable coprocessor programming code.

12. The method of claim 11, wherein the step of selecting one of the host microprocessor or the set of programmable coprocessors includes comparing the amount of time the host microprocessor uses to run the first host microprocessor programming code with the amount of time the set of programmable coprocessors uses to run the first programmable coprocessor programming code and selecting the one of the host microprocessor or the set of programmable coprocessors in accordance with a lessor of the amount of time.

13. The method of claim 11, further including the steps of:

providing an acceptance index;

generating a first performance index during the step of creating a first software program that is executable on the host microprocessor;

comparing the first performance index with the acceptance index; and when the first performance index is less than the acceptance index performing the steps of:

allocating a second set of programmable coprocessors from the plurality of programmable coprocessors;

compiling the software application code with the host microprocessor and the second set of programmable coprocessors; and creating a second software program that is executable on the host microprocessor.

14. The method of claim 11, wherein the step of compiling the software application code with the host microprocessor and the second set of programmable coprocessors includes:

generating a second host microprocessor programming code from a portion of the software application code;

generating a second programmable coprocessor programming code from the portion of the software application code;

determining an amount of time the host microprocessor uses to run the second host microprocessor programming code;

determining an amount of time the second set of programmable coprocessors uses to run the second programmable coprocessor programming code; and selecting one of the host microprocessor or the second set of programmable coprocessors in accordance with the amount of time the host microprocessor uses to run the second host microprocessor programming code and the amount of time the second set of programmable coprocessors uses to run the second programmable coprocessor programming code.

15. The method of claim 14, wherein the step of selecting one of the host microprocessor or the second set of programmable coprocessors includes the steps of:

providing an acceptance index;

comparing the amount of time the host microprocessor uses to run the second host microprocessor programming code with the amount of time the set of programmable coprocessors uses to run the second programmable coprocessor programming code;

selecting the one of the host microprocessor or the second set of programmable coprocessors in accordance with a lessor of the amount of time;

generating a second performance index during the step of creating a second software program that is executable on the host microprocessor;

comparing the second performance index with the acceptance index; and when the second performance index is less than the acceptance index performing the steps of:

allocating another set of programmable coprocessors from the plurality of programmable coprocessors;

compiling the software application code with the host microprocessor and the another set of programmable coprocessors; and creating another software program that is executable on the host microprocessor.

16. The method of claim 8, wherein the step of generating a software program includes the steps of:

downloading a microcode to the first set of programmable coprocessors;

starting the first set of programmable coprocessors to execute the microcode;

transferring data to the first set of programmable coprocessors; and receiving results from the first set of programmable coprocessors.

17. A computing system, comprising:

a host microprocessor;

a plurality of programmable coprocessors and a netlist representation for each of the plurality of programmable coprocessors, wherein each programmable coprocessor of the plurality of programmable coprocessors has a similar architectural style;

a plurality of building blocks for the plurality of programmable coprocessors and a description of each building block of the plurality of building blocks;

a software application program; and a compiler capable of extracting the functionality of each programmable coprocessor from the netlist representation and compiling the software application program, the netlist representation for each programmable coprocessor of the plurality of programmable coprocessors, and the description of the plurality of building blocks and creating a software program, wherein the software program is:

executable on the host microprocessor;

programs at least one programmable coprocessor from the plurality of programmable coprocessors to perform a function;

executes a portion of the software application on the host microprocessor: and dispatches a portion of the software application to one or more of the plurality of programmable coprocessors.

18. The computing system of claim 17, further including an acceptance index.

19. The computing system of claim 17, wherein the plurality of building blocks includes elements selected from the group consisting of multiplexers, registers, register files, bus drivers, arithmetic logic units, sequencers, random access memories, and read only memories.

20. The computing system of claim 17, wherein the software application program is written in a programming language from the group consisting of C, $C^{++}$, ADA, and Pascal.

21. The computing system of claim 17, wherein each programmable coprocessor of the plurality of programmable coprocessors comprises a sequencer and a programmable interconnection network.

* * * * *